United States Patent
Vaccaro et al.

[11] Patent Number: 6,049,099
[45] Date of Patent: Apr. 11, 2000

[54] CADMIUM SULFIDE LAYERS FOR INDIUM PHOSPHIDE-BASED HETEROJUNCTION BIPOLAR TRANSISTORS

[75] Inventors: Kenneth Vaccaro, Acton; Helen M. Dauplaise, Brockton; Andrew Davis, Boston; Joseph P. Lorenzo, Stow, all of Mass.

[73] Assignee: The United States of America as represented by the Secretary of the Air Force, Washington, D.C.

[21] Appl. No.: 09/075,435

[22] Filed: May 11, 1998

[51] Int. Cl.$^7$ .................................................. H01L 31/0328
[52] U.S. Cl. ............................................. 257/200; 257/201
[58] Field of Search ....................................... 257/200, 201

[56] References Cited

U.S. PATENT DOCUMENTS 5,488,233  1/1996  Ishikawa et al. ........................ 257/94
5,773,850  6/1998  Naniwae .................................. 257/78

Primary Examiner—Olik Chaudhuri
Assistant Examiner—Douglas A. Wille
Attorney, Agent, or Firm—Stanton E. Collier

[57] ABSTRACT

A novel indium phosphide (InP) based heterojunction bipolar transistor (HBT) is described. A II-VI compound, cadmium sulfide (CdS), is used as the emitter to improve the emitter injection efficiency and reduce recombination losses. The cadmium sulfide emitter is applied following the epitaxial growth of III-V compound collector and base regions. The large valence band discontinuity ($\Delta E=0.75$ eV) between CdS and InP allows InP to be used for both the base and collector material. Prior to cadmium sulfide deposition, the exposed surfaces of the epitaxial layers can be passivated with sulfur, further reducing the recombination losses.

10 Claims, 4 Drawing Sheets

CADMIUM SULFIDE LAYERS FOR INDIUM PHOSPHIDE-BASED HETEROJUNCTION BIPOLAR TRANSISTORS

STATEMENT OF GOVERNMENT INTEREST

The present invention may be made by or for the Government for governmental purposes without the payment of any royalty thereon.

BACKGROUND OF THE INVENTION

The present invention relates to the field of bipolar transistors.

High speed and high power bipolar transistors are desirable for microwave and millimeter wave integrated circuits. The heterojunction bipolar transistor (HBT) was proposed by Schockley, U.S. Pat. No. 2,569,347, and later developed by Kroemer, see "Heterostructure Bipolar Transistors and Integrated Circuits," Proceedings of the IEEE, Vol. 70, No.1, January 1982. A HBT uses a wider bandgap semiconductor for the emitter than for the base to improve the emitter injection efficiency. Higher injection efficiency results in higher common-emitter current gain. The device designer can trade off the higher current gain for higher base doping or lower emitter doping. Higher base doping reduces the base spreading resistance, allowing higher frequency operation at higher current and power. Lower emitter doping reduces base-emitter capacitance, also allowing higher frequency operation.

A material system suitable for HBT fabrication is based on III-V compounds lattice matched to InP. A schematic drawing of a prior art HBT is shown in FIG. 1a. The collector structure 1 typically consists of epitaxial layers of indium gallium aluminum arsenide (InGaAlAs) or indium gallium arsenide phosphide (InGaAsP), lattice matching InP substrate 3 via sub-collector region 2 over a wide range of compositions. Typically, the base 5 is indium gallium arsenide ($In_{0.53}Ga_{0.47}As$) with a bandgap, $E_g$, of 0.75 eV. If the base-collector junction 7 is a homojunction, the transistor is referred to as a single heterojunction bipolar transistor (SHBT). If the base-collector junction is also a heterojunction, the transistor is referred to as a double heterojunction bipolar transistor (DHBT). Commonly used emitter materials of emitter 9 are indium aluminum arsenide ($In_{0.52}Al_{0.48}As$) and InP. $In_{0.52}Al_{0.48}As$ has a room temperature bandgap of 1.4 eV and InP has a bandgap of 1.35 eV. The band diagram for a typical SHBT is shown in FIG. 1b and the band diagram for a typical DHBT is shown in FIG. 1c.

InP-based HBTs have the advantage of high electron saturation velocity and high electron mobility. The emitter-base bandgap discontinuity is split between the conduction and valance bands. For an n-p-n transistor, it is desirable to have the majority of the bandgap discontinuity located in the valance band. A large valance band discontinuity impedes hole transport from the base to the emitter without impeding electron injection from the emitter into the base. Electrons injected into the base region diffuse or drift to the collector. A drawback of the DHBT is the conduction band discontinuity, which reflects electrons back into the base. The band structure can be modified to reduce the undesirable effect of the conduction band discontinuity by grading the transition between materials over a finite distance during epitaxial growth. See the aforesaid Kroemer publication.

It is not necessarily easy to design and grow an optimized heterostructure for an HBT while keeping good crystalline quality, but with the appropriate choice of material the majority of the bandgap discontinuity will appear in the valance band. Several devices with excellent high frequency performance have been demonstrated with InP-based materials. Although several InP-based HBTs have been demonstrated, commercialization is hampered by material related problems that affect performance and long term reliability. Surface recombination at the emitter-base junction periphery and stability of the emitter-base junction doping profile are identified as two critical problems remaining to be solved.

When shrinking the device dimensions to alleviate the performance limiting effects of capacitance, surface recombination becomes a serious concern. Surface recombination degrades the current gain by capturing carriers that would normally traverse the base-emitter junction. Higher than optimal base currents are required to overcome the high surface recombination velocity of III-V compounds. As with surface recombination, emitter-base junction recombination at the heterointerface decreases the gain. Recombination at the heterointerface is mainly due to imperfections in the crystal lattice across the transition region. Recombination currents also degrade the noise performance of the transistor.

When high base doping is utilized in an n-p-n HBT design to reduce base spreading and series resistance, the stability of the doping profile becomes problematic. Diffusion of the base dopant (e.g., zinc) is responsible for repositioning the electrically active junction away from the heterojunction into the wide bandgap emitter. See T. Kobayashi, K. Kurishima, U. Gosele, "Suppression of abnormal Zn diffusion in InP/InGaAs heterojunction bipolar transistor structures," Appl. Phys. Lett., Vol. 62, No. 3, Page 284.

Field-enhanced diffusion of the base dopant is commonly observed during accelerated lifetime tests. Once a significant level of dopant atoms cross the heterointerface to convert the carrier type of the wide gap material to p-type, a homojunction exists in the wide gap material. Displacement of the electrically active p-n junction away from the heterointerface eliminates the advantage normally gained from the valance band discontinuity. Various p-type dopants (e.g., beryllium and carbon) with low coefficients of diffusion in $In_{0.53}Ga_{0.47}As$ are currently being used to reduce the problem of junction movement associated with impurity redistribution.

SUMMARY OF A PREFERRED EMBODIMENT OF THE INVENTION

A hetrojunction bipolar transistor is epitaxially formed by providing a III-V compound heavily doped sub-collector upon a substrate, thereafter growing a III-V compound collector element upon the sub-collector having a lower donor level, growing a III-V compound base element upon the collector element heavily doped with a p-type acceptor, and then growing a CdS emitter element having an n-type donor upon the base layer after passivation of the base layer with sulfur.

BRIEF DESCRIPTION OF THE DRAWINGS

Other features and advantages of the invention will become more apparent upon study of the following description, taken in conjunction with the drawings in which.

DETAILED DESCRIPTION OF PREFERRED EMBODIMENTS OF THE INVENTION

Figure 1A:
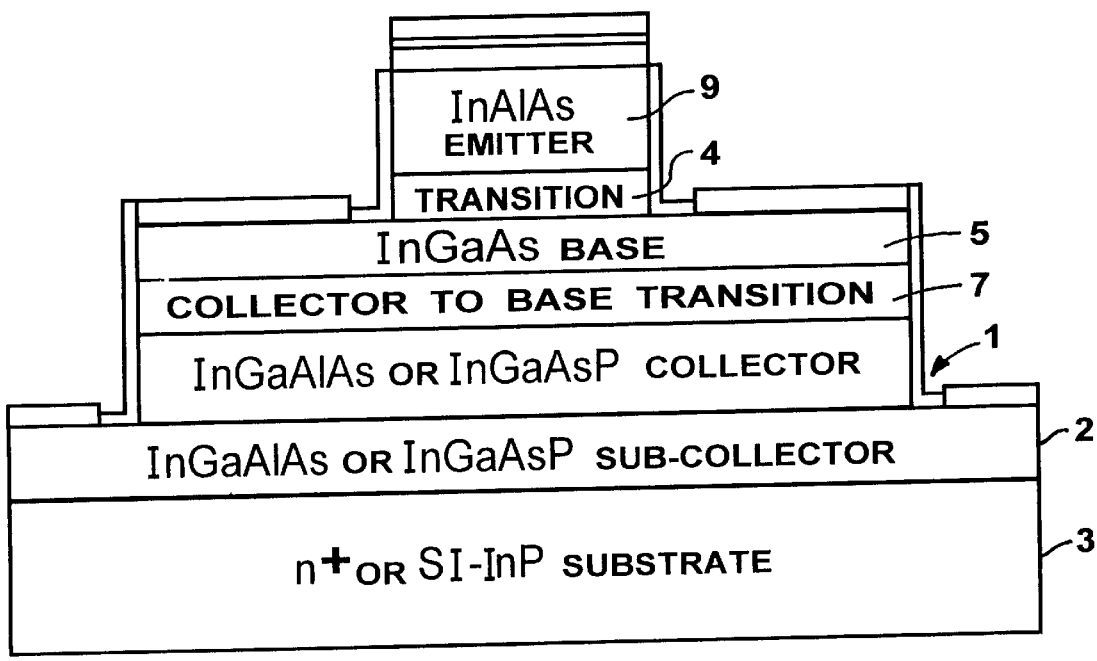
FIG. 1a is a schematic diagram of a cross section of a prior art epitaxial structure of an InP-based HBT.
Figure 1B:
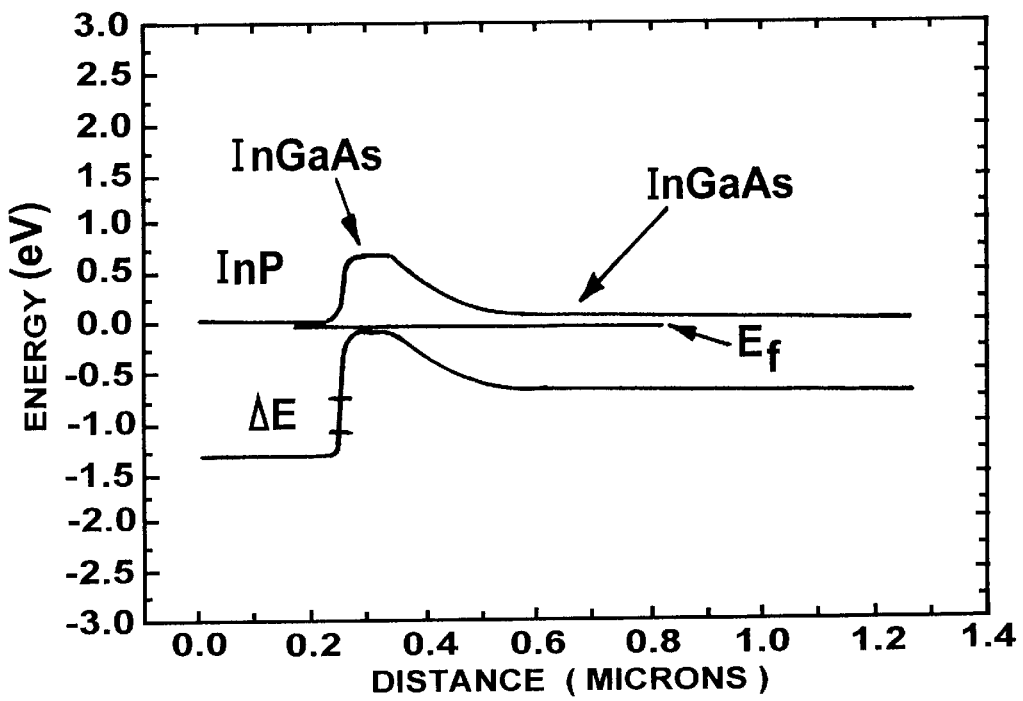
FIG. 1b is a schematic diagram of the energy band lineup of a SHBT.
Figure 1C:
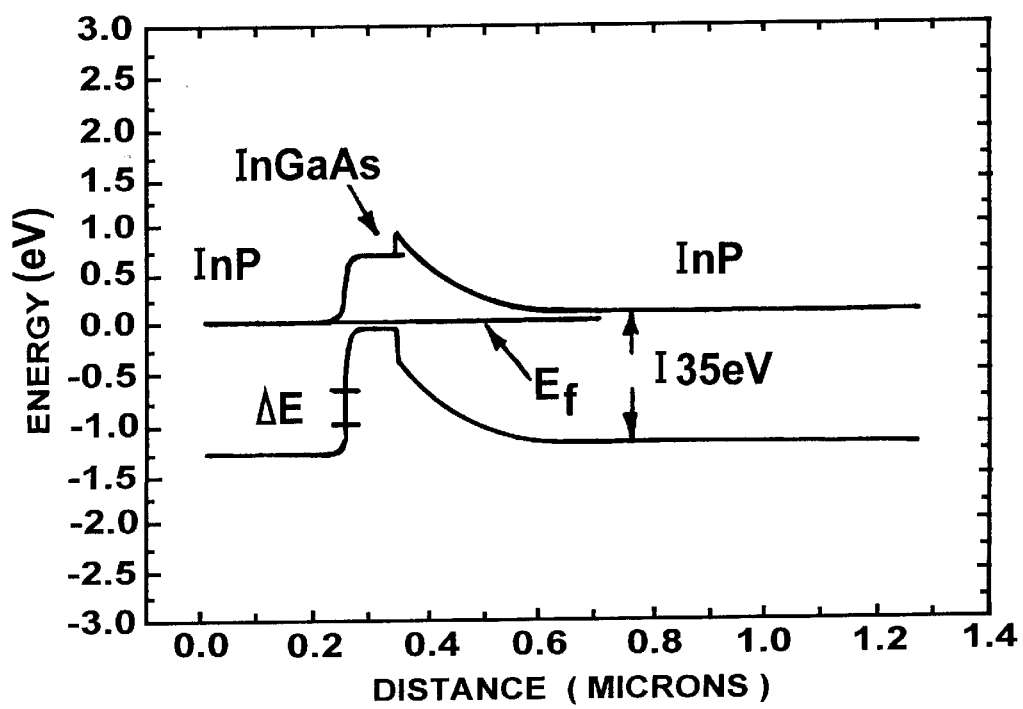
FIG. 1c is a schematic diagram of the energy band lineup of a DHBT.
Figure 2A:
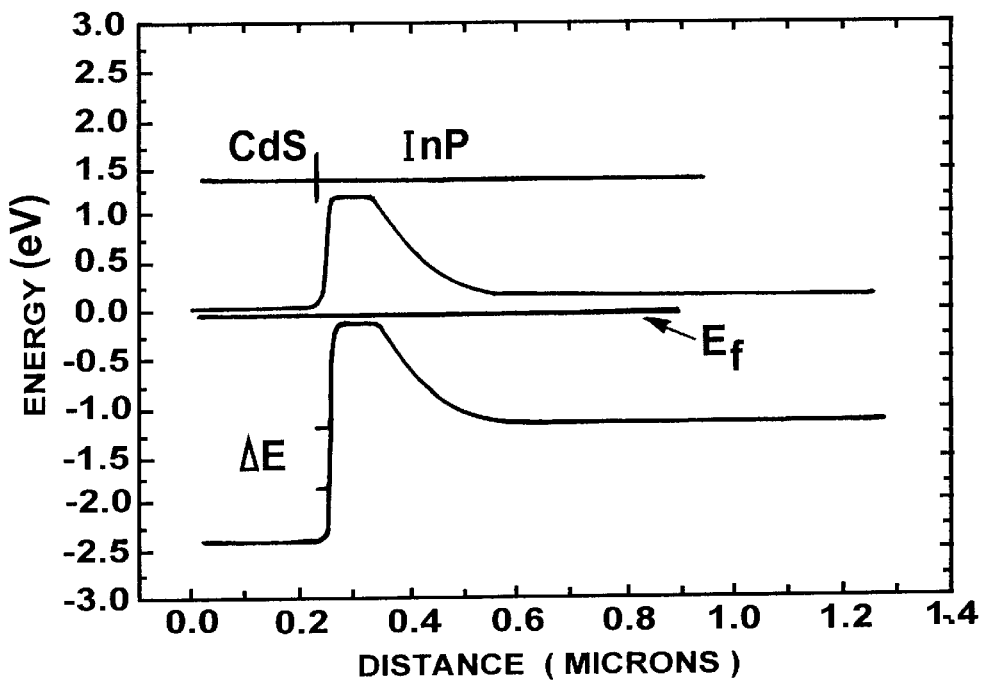
FIG. 2a is a schematic diagram of the energy band lineup of a CdS emitter SHBT.
Figure 3A:
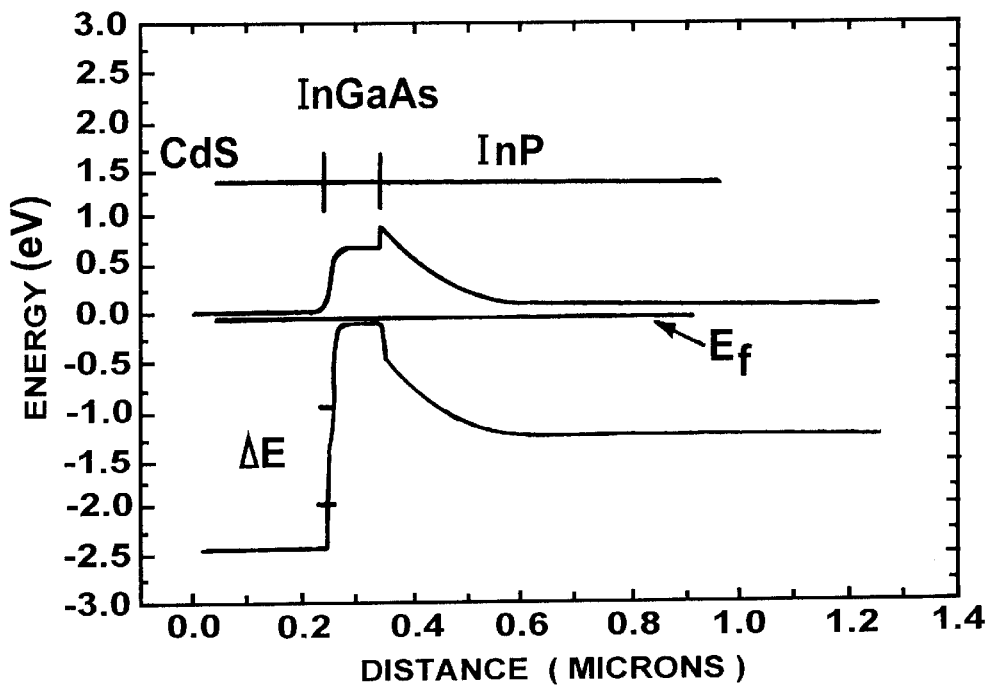
FIG. 3a is a schematic diagram of the band lineup of a CdS emitter InP-based DHBT.

The InP-based HBT of the invention uses the II-VI compound cadmium sulfide (CdS) for the emitter. CdS is a wide-bandgap ($E_g$=2.42 eV) semiconductor with a lattice constant that matches crystalline InP within 0.6%. As shown in FIG. 2a and 3a, CdS has a favorable energy band alignment to InP and InGaAs, with the majority of the bandgap discontinuity distributed in the valance band. Before making the present invention, we demonstrated that a suitable CdS/InP interface can be prepared with a low density of electrically active defects. H. M. Dauplaise, K. Vaccaro, A Davis, and J. P. Lorenzo, "Analysis of thin CdS layers on InP for improved metal-insulator-semiconductor devices," Jour. Appl. Phys., Vol. 80, No. 5, September 1996.

High base doping concentrations will no longer cause problems with reliability or stability in InP-based HBTs if CdS emitters are used. The group III elements, e.g., indium, are used as donors in CdS. Group m elements are not electrically active in InP. The group II elements, e.g., zinc, are used as acceptors in InP. The group II elements are not electrically active in CdS. Therefore, the diffusion of impurity atoms across the CdS/InP heterojunction in either direction would not substantially alter the density of electrically active carriers, and the observed problem with dopant redistribution in m-V InP-based HBTs is potentially eliminated with a CdS emitter.

An additional benefit of using CdS as the emitter material is that InP can be used for both the base and collector regions. The valance band offset between CdS and InP is nearly 0.75 eV, while the conduction band offset is only 0.27 eV. InP in the base and collector, shown in FIG. 2b, results in high carrier saturation velocity with large breakdown voltage. High carrier saturation velocity leads to high speed and high breakdown voltage leads to high power output.

Figure 2B:
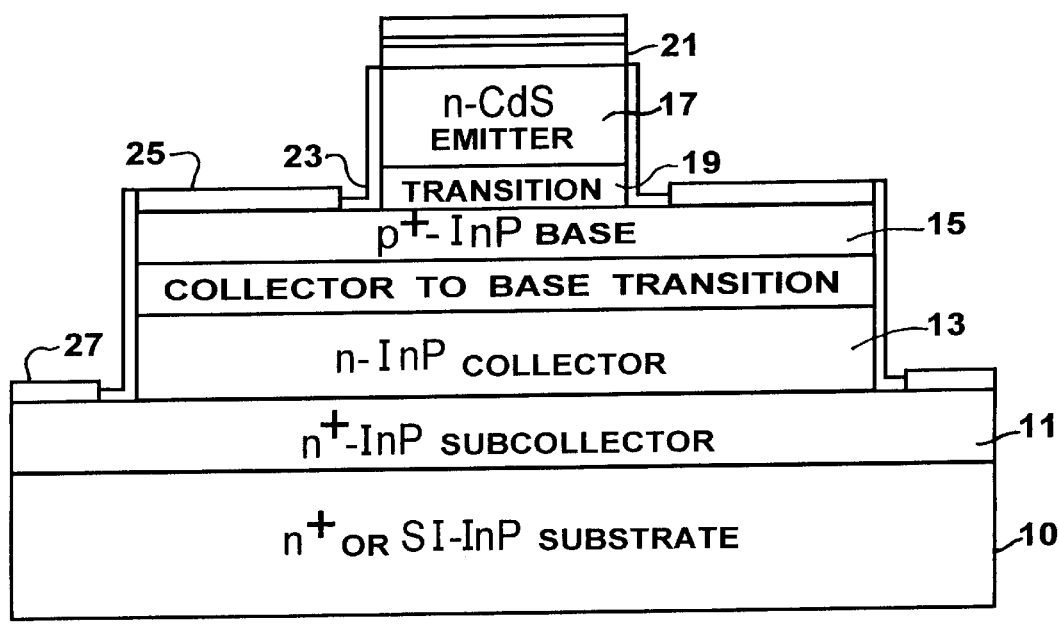
FIG. 2b is a schematic diagram of a cross section of a CdS emitter InP-based SHBT.

CdS-emitter InP-based SHBTs can be made from epitaxial layers grown on semi-insulating (SI) or n$^+$-InP substrates such as 10 of FIG. 2b. Epitaxial layers on InP are commonly grown with metal-organic chemical vapor deposition (MOCVD) or gas-source molecular beam epitaxy (MBE). The sub-collector 11, collector 13, and base 15 are sequentially grown. For an n-p-n structure the sub-collector is heavily doped with an n-type donor. The collector is grown next with a lower donor level to insure low capacitance at the base-collector junction. The base follows, doped with a p-type acceptor. A high base doping concentration is used to reduce parasitic contact resistance and base spreading resistance. A diagram showing the energy band alignment for a CdS-emitter InP based SHBT is shown in FIG. 2a.

For a SHBT any latticed matched composition of InGaAlAs or InGaAsP can be used for the base and collector. The base and collector are typically $In_{0.53}Ga_{0.47}As$ to insure a large valance band discontinuity between the emitter and base. For a CdS-emitter SHBT of FIG. 2b, InP makes a suitable base and collector material since the bandgap of CdS is over 1 eV larger than the bandgap of InP. Ion-implanted or diffused InP substrates would consequently make suitable starting material. The n$^+$-subcollector 11, grown on substrate 10, and n-collector 13 are formed by silicon or tin implants or diffusions to the appropriate depths and doses. The p-type base 15 is formed by shallow zinc or beryllium implants or diffusion. After an implant activation anneal, the surface is cleaned and prepared in order to promote high quality CdS growth.

The CdS emitter layer 17 can be grown immediately following III-V compound growth in a specialized III-V/II-VI growth chamber or grown ex situ with a variety of techniques. CdS has been grown epitaxially on InP with several techniques: MBE, MOCVD, laser ablation, and chemical bath deposition (CBD). When an ex-situ growth process is used to deposit the CdS, all exposed III-V surfaces 13, 15, and 19 can be passivated with sulfur or CdS as described in U.S. Pat. No. #5,689,125 to Vaccaro et al., prior to performing the CdS growth. The CdS emitter 17 is n-type. Two known donor impurities in CdS are indium and boron.

We currently grow CdS on InP using solid source MBE. The InP layer 15 is cleaned and passivated with sulfur, forming portion 19. After loading the InP substrate into the MBE chamber through a high-vacuum load-lock, the sample is heated to remove adsorbed oxygen, water, and hydrocarbons. A single effusion cell is used to generate a flux of CdS. A second effusion cell is used to provide a flux of indium. Indium is an n-type dopant in CdS. The n-type CdS emitter 17 is deposited while substrate 10 and its supported layers, including InP substrate 1S, are held at 200 C.

The emitter contact metal 21 can now be deposited onto the surface of the CdS and defines the emitter area. CdS beyond the emitter area can be selectively removed from the III-V base material with HCl or HF using the emitter contact as a mask. After selectively removing CdS outside of the emitter area, the exposed base-emitter periphery 23 may be advantageously passivated with sulfur or sulfur/CdS. Self aligned contacts 25 are made to the III-V base 15 by using the overhanging emitter metal to block the base contact metal from shorting against the emitter side wall. The collector material is exposed by removing the base material beyond the base contact down to the collector contact region (sub-collector). Contact metal can then be applied to the sub-collector at 27.

Figure 3B:
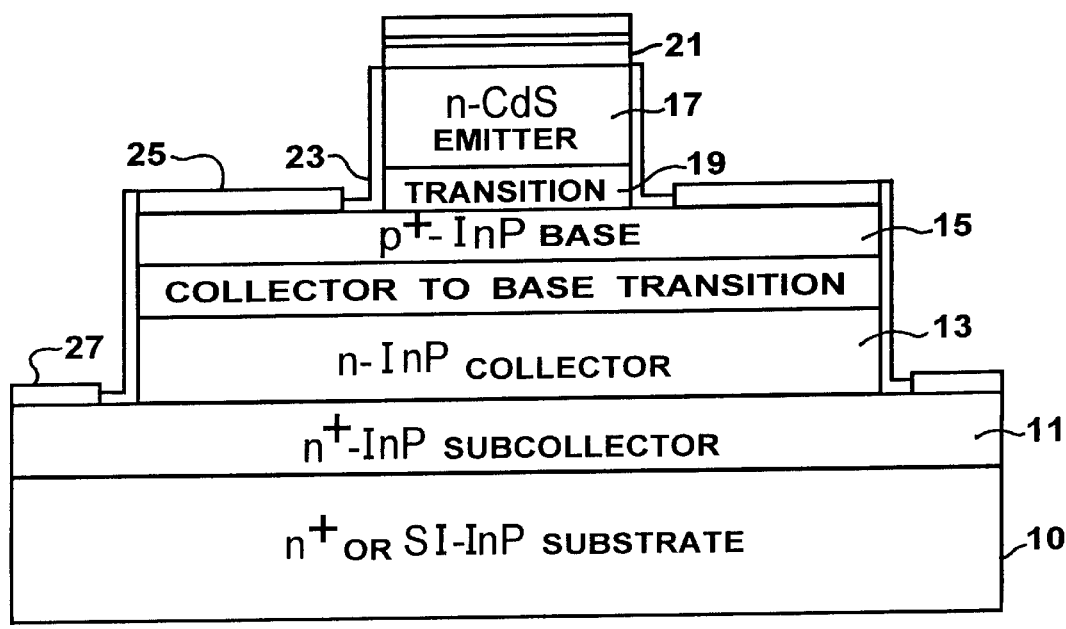
FIG. 3b is a schematic diagram of a CdS emitter InP-based DHBT

Hetero-epitaxial layers grown on InP substrates make suitable starting material for CdS-emitter DHBTs. A schematic diagram of a CdS emitter InP-based DHBT is shown in FIG. 3b. The sub-collector, collector, and base, labeled as in FIG. 2b, of an InP-based HBT are sequentially grown epitaxially on Inp substrate 10. The collector structure 13 consists of epitaxial layers of indium gallium aluminum arsenide (InGaAlAs) or indium gallium arsenide phosphide (InGaAsP), lattice matching InP over a wide range of compositions. For a nip-based DHBT, the collector is typically the III-V compound $In_{0.52}Al_{0.48}As$ or InP. The base is typically the narrow gap III-V compound $In_{0.53}Ga_{0.47}As$. For an n-p-n structure the collector is n-type and the base is p-type. A typical donor impurity is silicon and typical acceptor impurities are zinc and beryllium. A diagram showing the energy band alignment for a CdS-emitter InP based DHBT is shown in FIG. 3a. After growing the CdS emitter layer, the fabrication steps are similar to the above example.

Embodiments of the invention other than those described will readily occur to the skilled worker in the art and thus the scope of the invention is to be limited solely to the terms of the following claims and art recognized equivalents thereof The following claims are intended to cover p-n-p devices as well as the described n-p-n devices, and the skilled worker will readily understand how to fabricate such devices by providing appropriate equivalent compounds, acceptors and dopants.

What is claimed is:

1. A hetrojunction bipolar transistor comprising:
   (a) a CdS emitter element;
   (b) a III-V compound collector element formed upon a substrate; and
   (c) a III-V compound base element formed between said emitter element and said collector element.

2. The bipolar transistor of claim 1 wherein said base and collector elements comprise indium phosphide.

3. The bipolar transistor of claim 2 wherein said emitter element comprises n-CdS, said base element comprises p+-InP, and said collector element comprises n-InP.

4. The bipolar transistor of claim 1 wherein said emitter element comprises n-CdS, base element comprises p+-InGaAs and said collector element comprises n-InP.

5. The bipolar transistor of claim 1 wherein said CdS emitter element has donor impurities therein of indium or boron.

6. A hetrojunction bipolar transistor comprising:
   (a) a CdS emitter element;
   (b) a III-V compound collector element of InAlAs or InP formed upon a substrate; and
   (c) a III-V compound base element of InGaAs formed between said emitter element and said collector element.

7. The bipolar transistor of claim 6 wherein said emitter element comprises n-CdS, said base element comprises p+-InP, and said collector element comprises n-InP.

8. The bipolar transistor of claim 6 wherein said emitter element comprises n-CdS, base element comprises p+-InGaAs and said collector element comprises n-InP.

9. The bipolar transistor of claim 6 wherein said base element and said collector element are made of a compound selected from the group consisting essentially of InGaAlAs and InGaAsP.

10. The bipolar transistor of claim 6 wherein said base element is made of narrow gap $In_{53}Ga_{47}As$.

* * * * *